United States Patent
Lim (10) Patent No.: US 7,704,826 B2
(45) Date of Patent: Apr. 27, 2010

(54) LEVELING ALGORITHM FOR SEMICONDUCTOR MANUFACTURING EQUIPMENT AND RELATED APPARATUS

(75) Inventor: Jong-Ho Lim, Anyang-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 851 days.

(21) Appl. No.: 11/483,497

(22) Filed: Jul. 10, 2006

(65) Prior Publication Data

US 2007/0188756 A1 Aug. 16, 2007

(30) Foreign Application Priority Data

Feb. 13, 2006 (KR) .................. 10-2006-0013897

(51) Int. Cl.
*H01L 21/8242* (2006.01)
(52) U.S. Cl. .................. 438/241; 438/106; 438/199; 438/75; 257/E21.329; 257/E21.347; 257/E21.475; 257/E21.617; 257/E21.632
(58) Field of Classification Search .................. 438/199, 438/241, 106, 75, 81, 308
See application file for complete search history.

(56) References Cited

U.S. PATENT DOCUMENTS

| | | | | |
|---|---|---|---|---|
| 3,900,013 A | * | 8/1975 | Vignozzi et al. | 123/335 |
| 4,655,552 A | * | 4/1987 | Togashi et al. | 349/24 |
| 4,819,070 A | * | 4/1989 | Hynecek | 348/302 |
| 4,876,585 A | * | 10/1989 | Ozawa | 257/54 |
| 4,980,546 A | * | 12/1990 | Berger | 250/208.1 |

FOREIGN PATENT DOCUMENTS

| | | |
|---|---|---|
| JP | 2001-332471 | 11/2001 |
| KR | 10-2003-0006828 | 1/2003 |
| KR | 10-2004-0070679 | 8/2004 |
| KR | 10-2005-0072348 | 7/2005 |

\* cited by examiner

*Primary Examiner*—David Nhu
(74) *Attorney, Agent, or Firm*—F. Chau & Associates, LLC

(57) ABSTRACT

A method of reading surface levels of a field defined on a substrate using a sensing apparatus having at least one cell array composed of a plurality of cells, in which some of the cells constituting the at least one cell array are selected and designated as available cells. Light is radiated onto a surface of the field. Light reflected to the available cells from the surface is sensed to extract available level signals. The available level signals may be calculated to read the surface level of the field. The surface level of the field are used in a method of controlling the level of an exposure apparatus controlling the substrate mounted on a leveling stage in up, down, right, left, front, back, and rotational directions using the surface level.

13 Claims, 11 Drawing Sheets

LEVELING ALGORITHM FOR SEMICONDUCTOR MANUFACTURING EQUIPMENT AND RELATED APPARATUS

CROSS-REFERENCE TO RELATED APPLICATION

This application claims the benefit of Korean Patent Application No. 2006-0013897, filed Feb. 13, 2006, the contents of which are hereby incorporated herein by reference in their entirety.

BACKGROUND OF THE INVENTION

1. Technical Field

The present disclosure relates to semiconductor manufacturing equipment, and more particularly, to a leveling algorithm for the semiconductor manufacturing equipment and a related apparatus.

2. Discussion of the Related Art

A process of manufacturing a semiconductor device includes a process of forming fine patterns on a semiconductor substrate, such as a silicon wafer. The process of forming the fine patterns may include a deposition process, a photoresist coating process, an exposure process, a development process, and an etching process. The exposure process includes transferring patterns to the photoresist using an exposure apparatus. A specialized technique is required for accurately transferring the patterns to exact positions of the photoresist for high integration of the semiconductor device. In addition, exposure apparatuses such as a scanner and a stepper widely employ a reduction projection exposure technique in which patterns formed on a reticle are reduced and transferred.

In general, the exposure apparatus has a light source, a condenser lens, a reticle, a projection lens, a wafer holder, and a leveling stage. A wafer coated with a photoresist is mounted on the wafer holder. Light transmitted through the reticle is projected onto the photoresist through the projection lens. The patterns formed on the reticle are transferred onto some regions of the photoresist on a field basis.

The surface of the photoresist should be positioned at the focal distance of the projection lens in order to accurately transfer the patterns. When the surface of the photoresist is closer or farther than the focal distance of the projection lens, patterning defects such as line thinning, end line shortening, and contact-not-open occur. The surface of the photoresist has different levels depending on the position, even on the same wafer. Accordingly, it is very important to read and control the surface level of the photoresist.

The leveling stage acts to adjust the wafer mounted on the wafer holder in up, down, right, left, front, back, and rotational directions. In order to effectively operate the leveling stage, the surface level of the photoresist should be accurately read.

Figure 1:
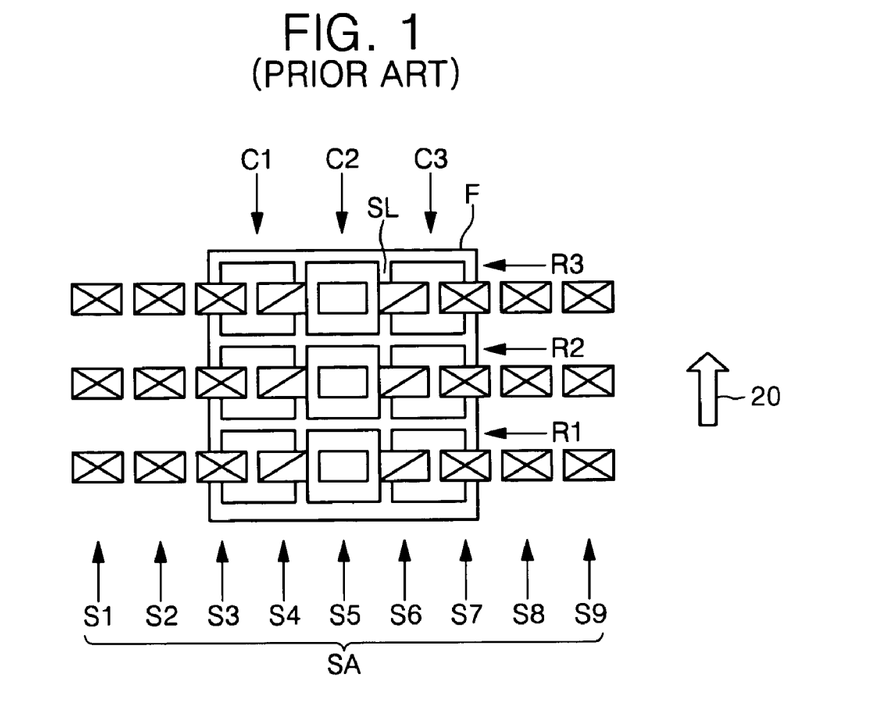
FIGS. 1 and 2 are conceptual diagrams for explaining a conventional method of reading surface levels.
Figure 2:
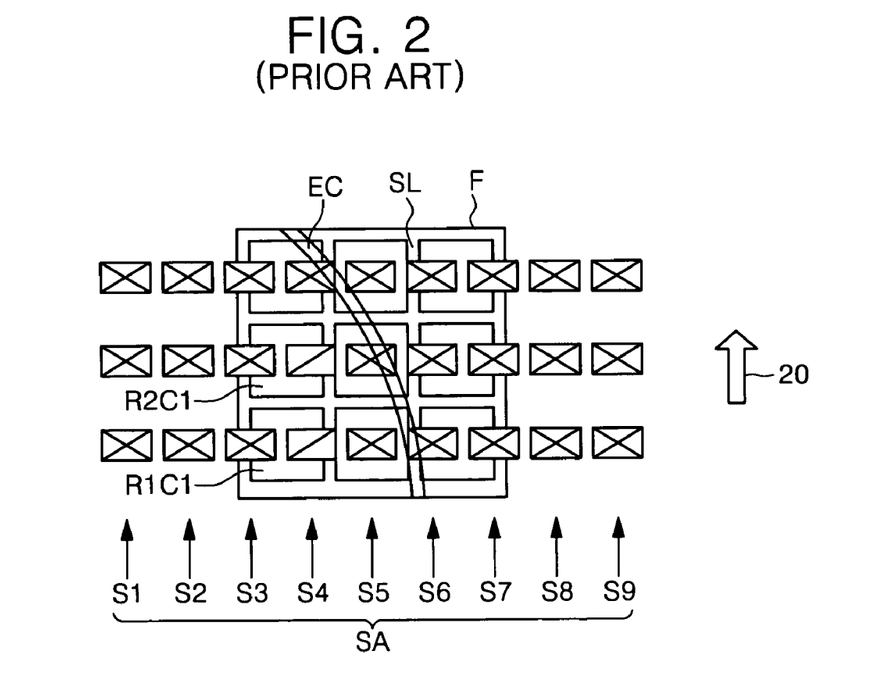

FIGS. 1 and 2 are conceptual diagrams for explaining a conventional method of reading a surface level.

Referring to FIG. 1, a field F defined on a semiconductor substrate is aligned with a sensing apparatus SA. The field F has a plurality of chips that are arranged in a two-dimensional manner along rows R1, R2, and R3, and columns C1, C2, and C3. That is, the field F has a first chip R1C1 arranged in the first column C1 of the first row R1 to a ninth chip R3C3 arranged in the third column C3 of the third row R3. In addition, the field F has scribe lines SL disposed between the chips R1C1 to R3C3. The field F may be classified into a measurement-allowed region and a measurement-restricted region. Light reflected from the surface of the photoresist is influenced by the pattern or the structure within the field F. Accordingly, the measurement-allowed region is set to overlap within the chips R1C1 to R3C3, and the measurement-restricted region is set to include the scribe lines SL.

The sensing apparatus SA has a plurality of sensors S1, S2, S3, S4, S5, S6, S7, S8, and S9. Any of the sensors S1, S2, S3, S4, S5, S6, S7, S8, and S9 that overlap at least a part of the measurement-restricted region or that are out of the field F are turned off, and only those sensors that are completely within the measurement-allowed region are turned on.

Light is radiated onto the surface of the field F. Light reflected to the sensor S5 from the surface is sensed to generate a level signal. Radiating the light, sensing the reflected light, and generating the level signal are sequentially carried out while moving in the direction of an arrow 20.

The level signal is calculated to read the surface level of the field F. In this case, level signals are obtained from the fourth chip R1C2, the fifth chip R2C2, and the sixth chip R3C2 arranged in the second column C2. In contrast, level signals cannot be obtained from the first chip R1C1, the second chip R2C1, the third chip R3C1, the seventh chip R1C3, the eighth chip R2C3, and the ninth chip R3C3 arranged in the first and third columns C1 and C3. That is, the surface levels of the second column C2 of the field F can be read whereas the surface levels of the first and third columns C1 and C3 cannot be read. Accordingly, the directional inclinations of the rows R1, R2, R3 of the field F cannot be read.

Referring to FIG. 2, the field F may be positioned on an edge of the semiconductor substrate. An edge clearance EC is set on the edge of the semiconductor substrate. The edge clearance EC may be in contact with the third chip R3C1, the fourth chip R1C2, the fifth chip R2C2 and the sixth chip R3C2. In this case, the measurement-restricted region is set to include the scribe line SL, the edge clearance EC, and the chips R3C1, R1C2, R2C2, and R3C2 in contact with the edge clearance EC. However, according to the conventional method of reading the surface level, both of the sensors S3 and S4 corresponding to the first column C1 are turned off. As a result, the surface levels cannot be read from the first chip R1C1 and the second chip R2C1.

Consequently, according to the conventional method of reading the surface level, there are many regions where the surface level of the field F cannot be read, moreover surface level readings that can be obtained may be inaccurate.

Other methods associated with the conventional method of reading the surface level are disclosed in Japanese Patent Laid-Open Publication No. 2001-332471 entitled "Exposure Apparatus" to Hiroshi Kurosawa. According to Kurosawa, when a focus error is found at the edge of a wafer, an apparatus capable of carrying out a focused exposure is provided. However, the exposure apparatus may frequently produce inferior patterns.

SUMMARY OF THE INVENTION

Exemplary embodiments of the present invention provide a method capable of accurately reading surface levels of a substrate having various patterns formed thereon.

Exemplary embodiments of the present invention provide a method of accurately controlling the level of an exposure apparatus.

Exemplary embodiments of the present invention provide a semiconductor exposure apparatus capable of accurately controlling the level of a substrate.

In an exemplary embodiment, the present invention is directed to a method of reading a surface level of a field defined on a substrate using a sensing apparatus having at least one cell array composed of a plurality of cells. The method comprises selecting some of the cells constituting the at least one cell array and selecting available cells. Light is radiated onto a surface of the field, and light reflected to the available cells from the surface is sensed to extract available level signals.

In exemplary embodiments of the present invention, the field may have a measurement-allowed region and a measurement-restricted region. In addition, the field may have a plurality of chips arranged in a two-dimensional array along row and column directions, a scribe line disposed between the chips, and an edge clearance. In this case, the measurement-allowed region may overlap the chips spaced apart from the edge clearance, and the measurement-restricted region may comprise the scribe line and the chips in contact with the edge clearance.

In exemplary embodiments, the available cells may correspond to the measurement-allowed region.

In exemplary embodiments, the cells constituting the cell array may be divided into small groups. Some of the small groups, which correspond to the measurement-allowed region, may be selected to designate the available cells.

In exemplary embodiments, the cells may be arranged within the cell array in a two-dimensional manner along row and column directions. Each cell may comprise a photodiode.

In exemplary embodiments of the present invention, the cell array may be a complementary metal oxide semiconductor (CMOS) image sensor or a charge coupled device (CCD).

In exemplary embodiments, the present invention is directed to a method of controlling a level of an exposure apparatus reading a surface level of a field defined on a substrate and controlling the level of the field using a sensing apparatus having at least one cell array composed of a plurality of cells. The method comprises selecting some of the cells constituting the at least one cell array to select available cells. Light is radiated onto a surface of the field, and light reflected to the available cells from the surface is sensed to extract available level signals. The surface level of the field is read using the available level signals. The substrate whose surface level is to be read is mounted on a leveling stage. The substrate mounted on the leveling stage is controlled in up, down, right, left, front, back, and rotational directions based on the detected surface level.

In an exemplary embodiment, the present invention is directed to a semiconductor exposure apparatus. The semiconductor exposure apparatus comprises a wafer holder for mounting a substrate on which a field is defined. A leveling stage is attached on one surface of the wafer holder, and adjusts the substrate mounted on the wafer holder in up, down, right, left, front, back, and rotational directions. An emitting unit is disposed to emit light toward a surface of the field, and a sensing apparatus is disposed to sense light reflected from the surface. The sensing apparatus has at least one cell array composed of a plurality of cells. A cell selection unit is provided to select some of the cells constituting the at least one cell array and select available cells. A calculation unit is provided to receive available level signals sensed from the available cells and read a surface level of the field. A controller is provided to transmit a position adjustment signal based on the surface level of the field. The controller is electrically connected to the leveling stage.

BRIEF DESCRIPTION OF THE DRAWINGS

Exemplary embodiments of the present invention can be understood in more detail from the following descriptions taken in conjunction with the accompanying drawings.

DETAILED DESCRIPTION OF THE INVENTION

The present invention will now be described more fully hereinafter with reference to the accompanying drawings, in which exemplary embodiments of the invention are shown.

Figure 3:
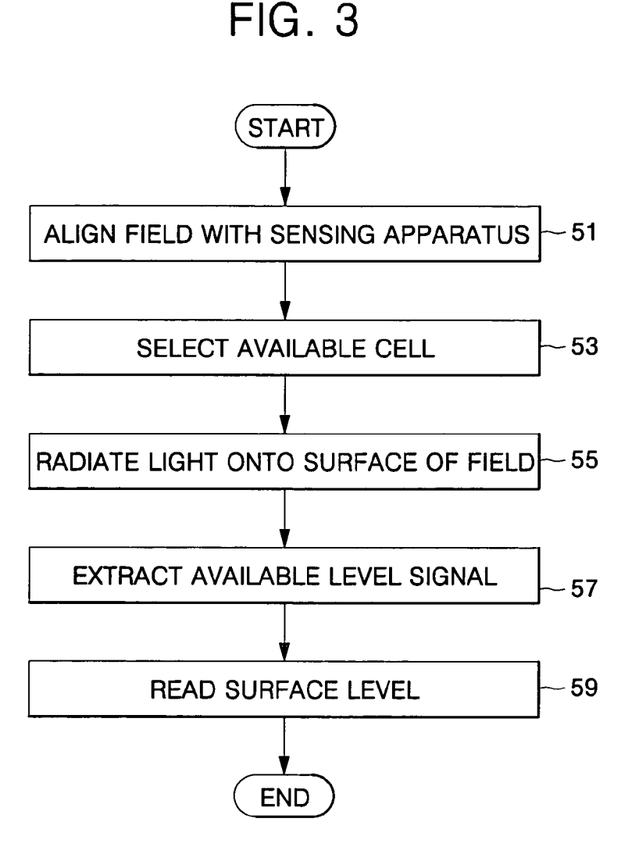
FIG. 3 is a flow chart for explaining a method of reading surface levels in accordance with an exemplary embodiment of the present invention.
Figure 4:
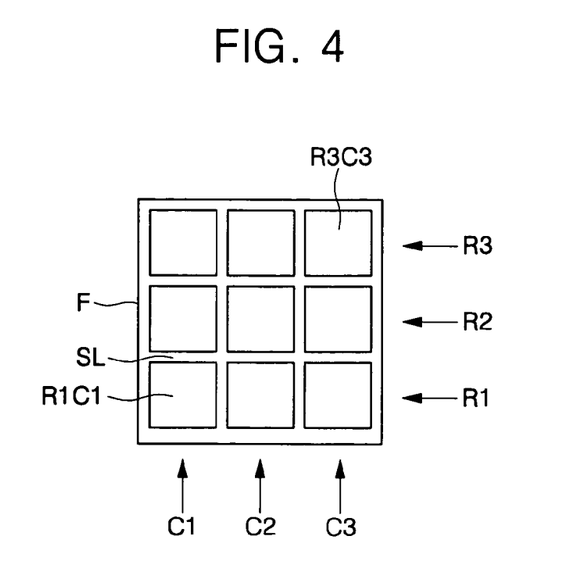
FIGS. 4 and 5 are plan views of main parts of a semiconductor substrate appropriate to an exemplary embodiment of the present invention.
Figure 5:
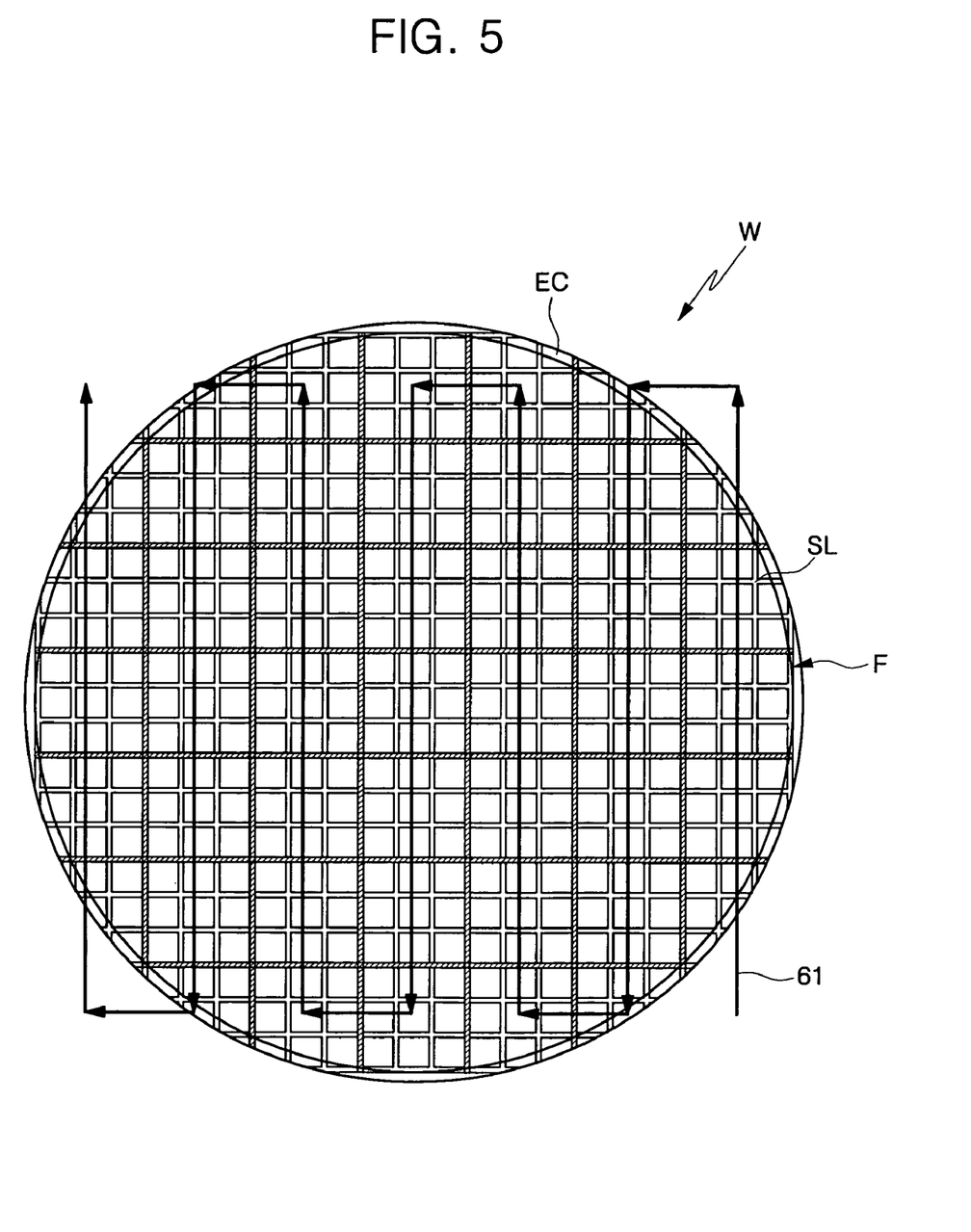
Figure 6:
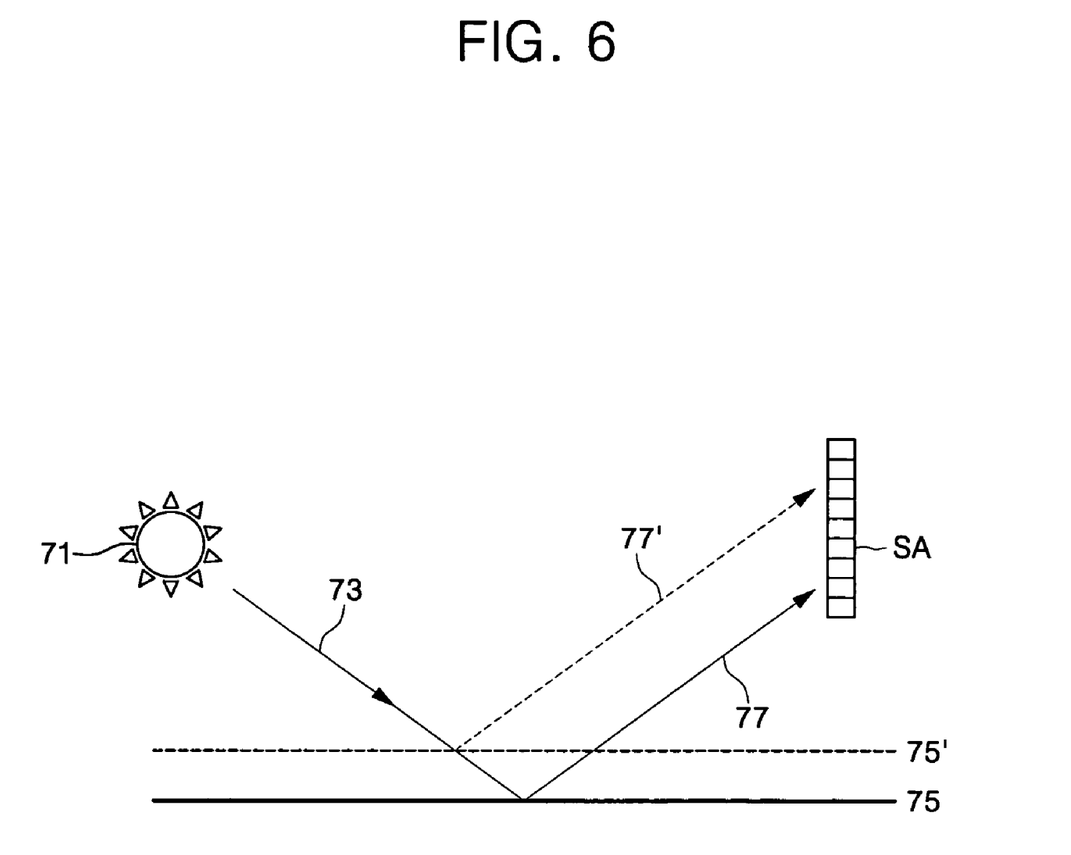
FIG. 6 is a conceptual diagram for explaining a level triangulation principle in accordance with an exemplary embodiment of the present invention.
Figure 7:
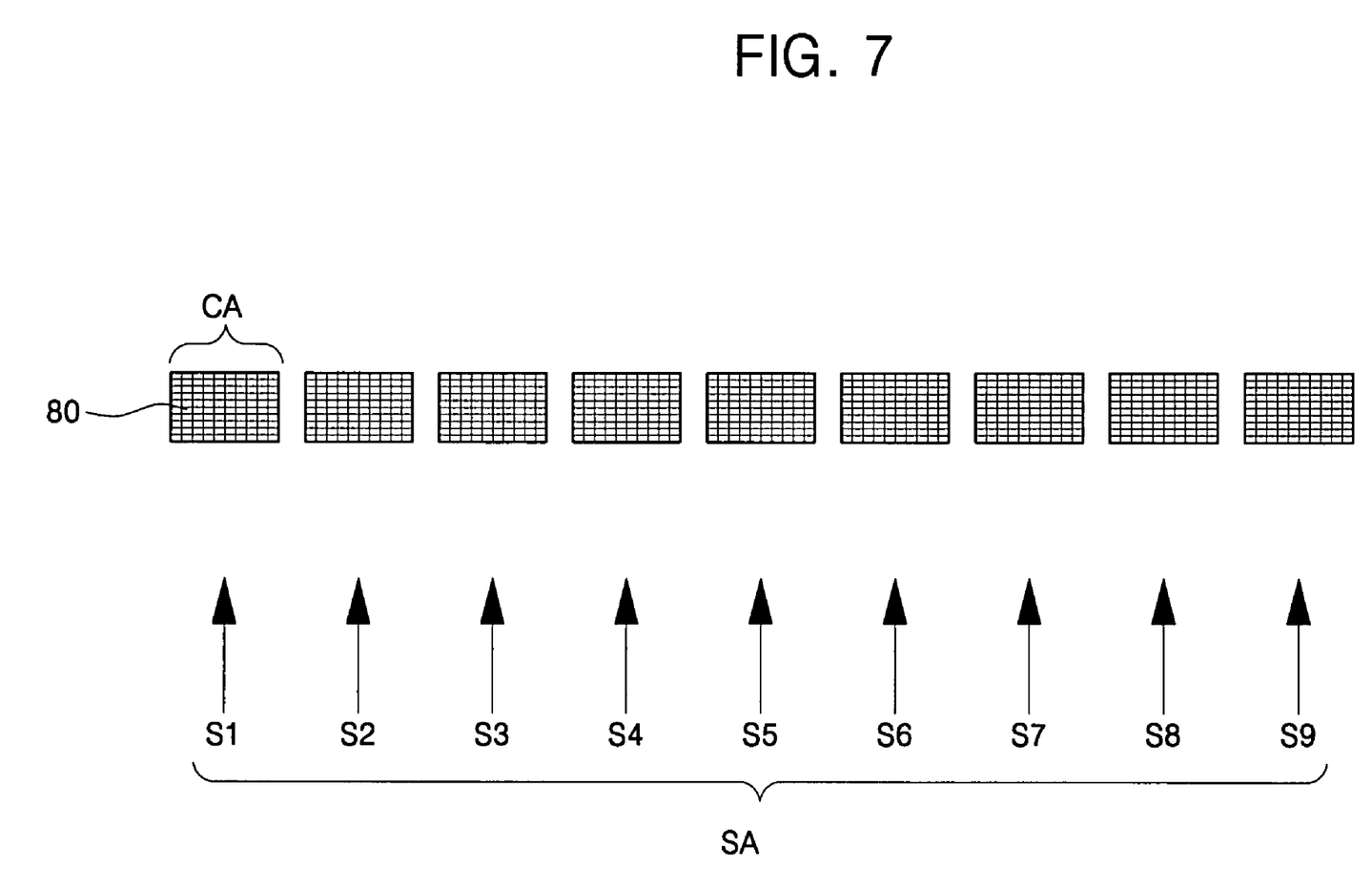
FIG. 7 is a conceptual diagram of main parts of a sensing apparatus appropriate to an exemplary embodiment of the present invention.
Figure 8:
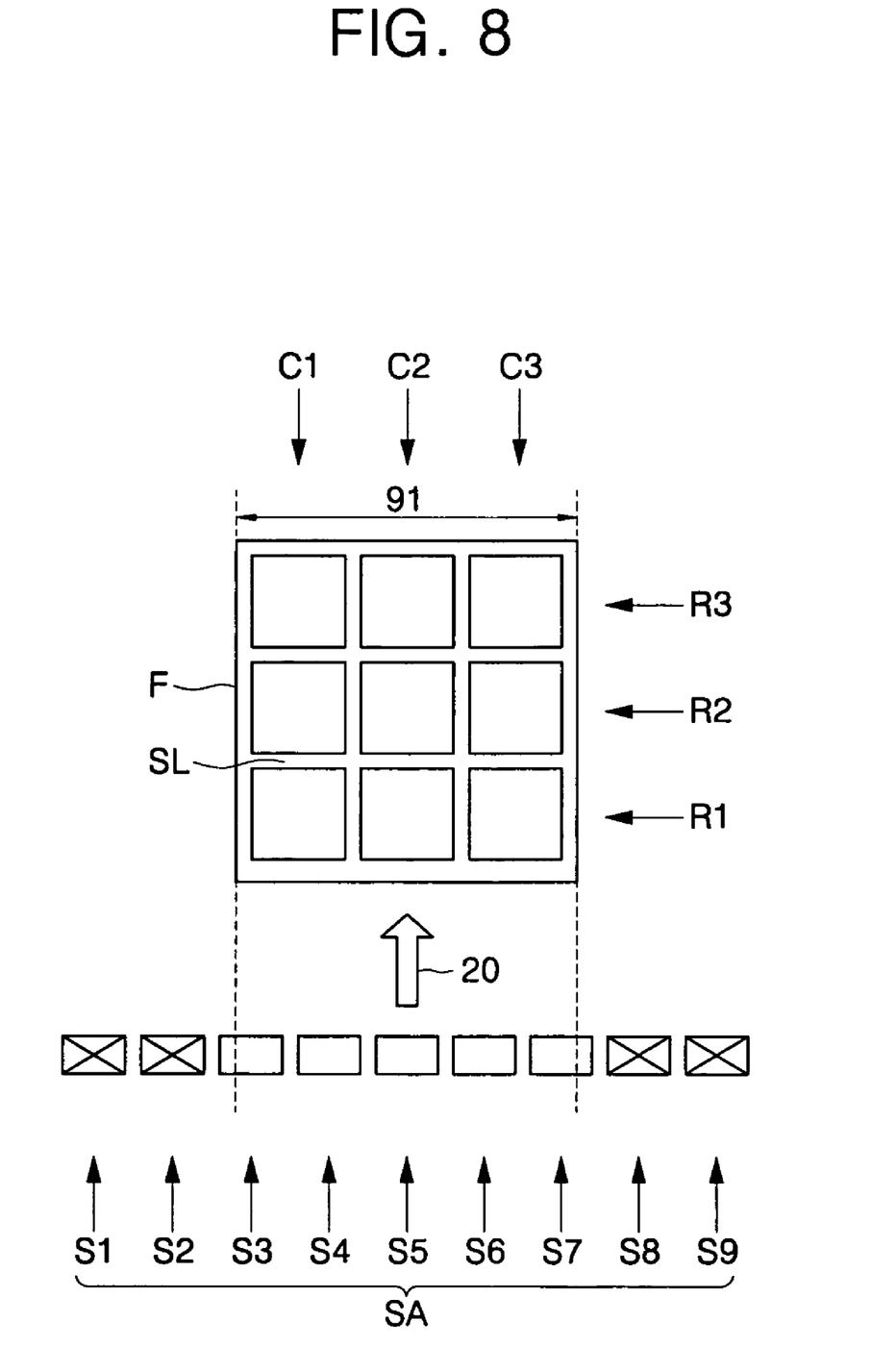
FIG. 8 is a conceptual diagram for explaining a method of measuring surface levels in accordance with an exemplary embodiment of the present invention.
Figure 9:
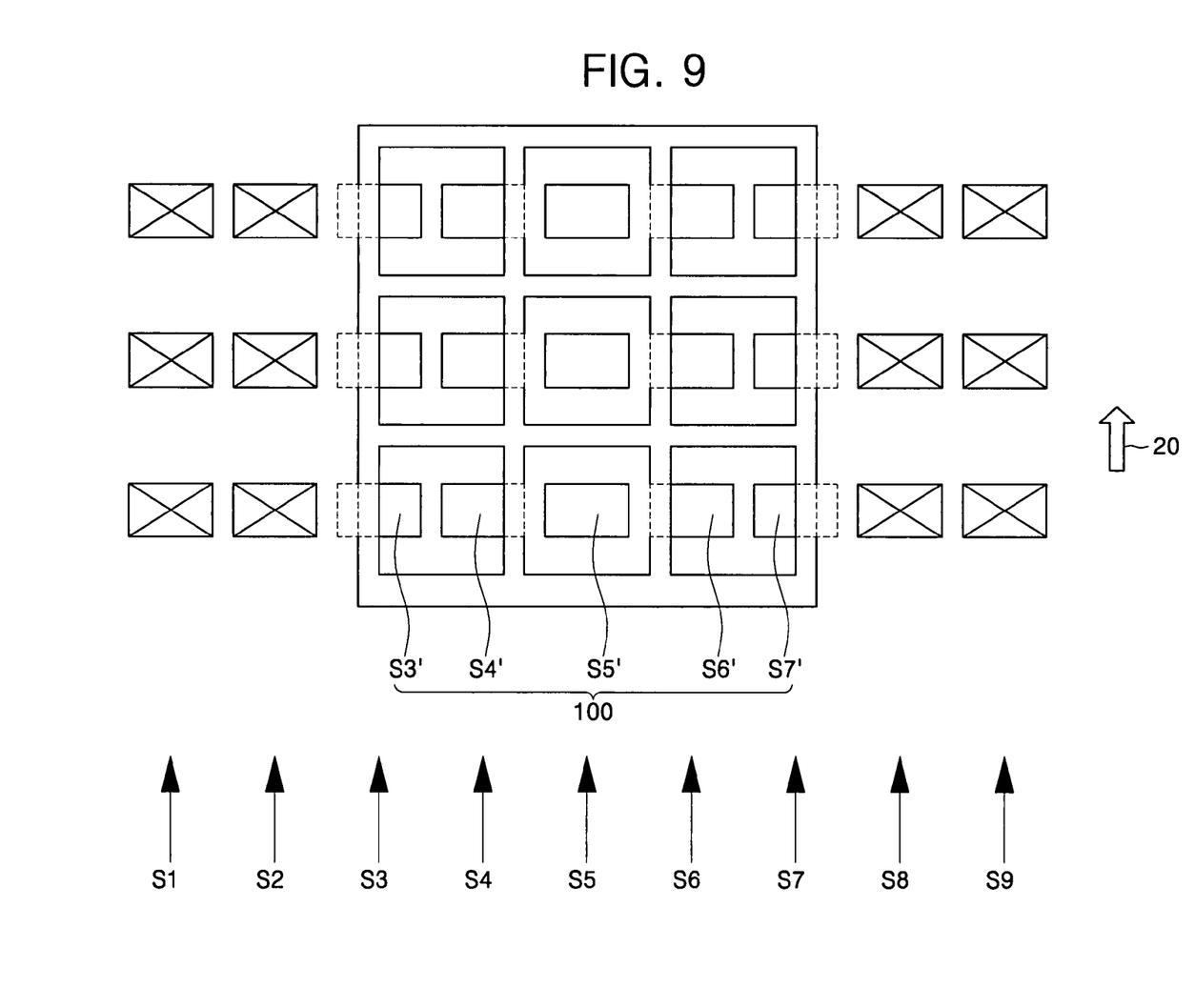
FIG. 9 is a conceptual diagram for explaining a method of reading surface levels in accordance with an exemplary embodiment of the present invention.
Figure 10:
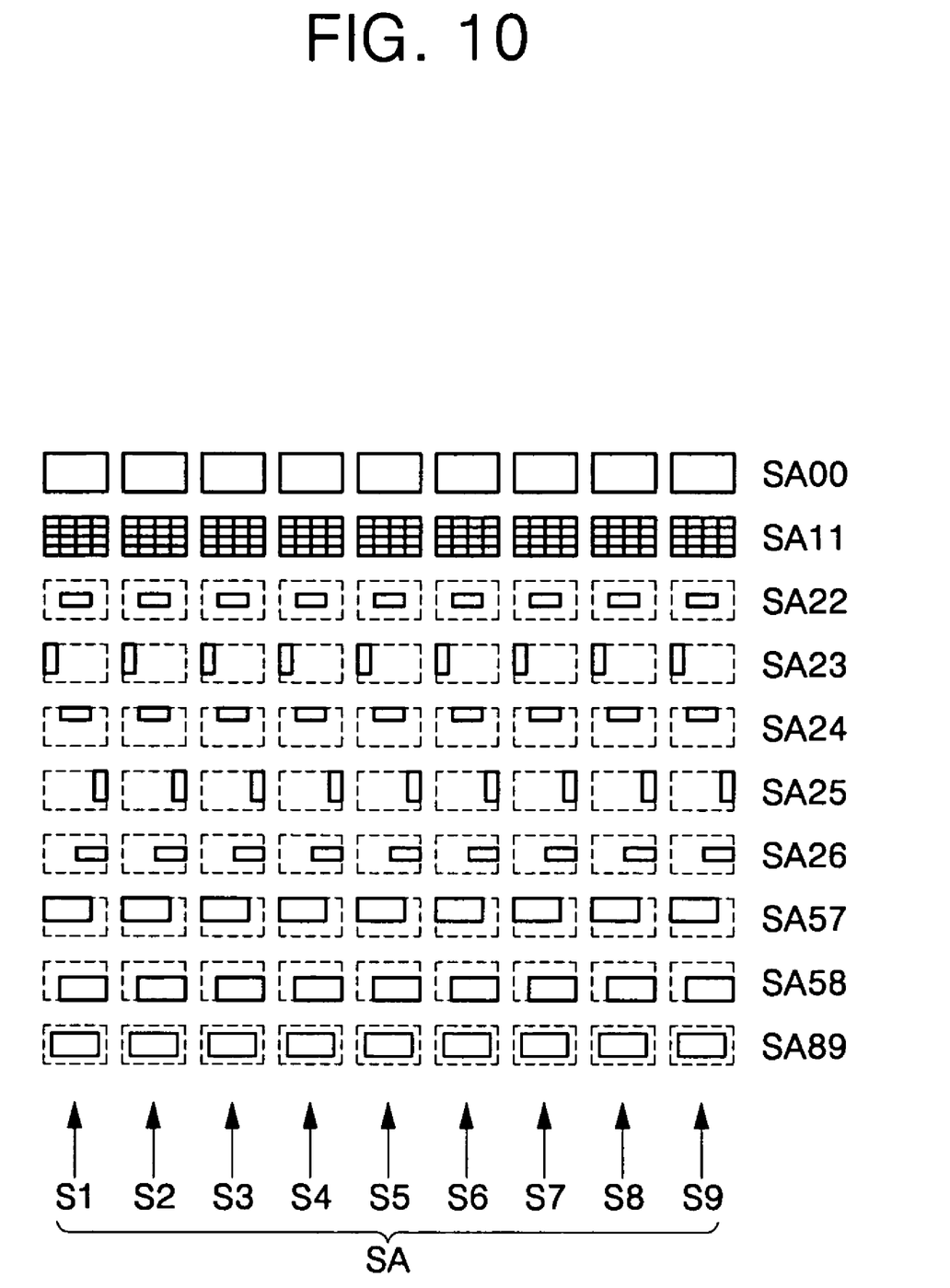
FIG. 10 is a conceptual diagram for explaining a method of selecting available cells in accordance with an exemplary embodiment of the present invention.

FIG. 3 is a flow chart for explaining a method of reading surface levels in accordance with an exemplary embodiment of the present invention, FIGS. 4 and 5 are plan views of main parts of a semiconductor substrate appropriate to an exemplary embodiment of the present invention, FIG. 6 is a conceptual diagram for explaining a level triangulation principle in accordance with an exemplary embodiment of the present invention, and FIG. 7 is a conceptual diagram of main parts of a sensing apparatus appropriate to an exemplary embodiment of the present invention. In addition, FIG. 8 is a conceptual diagram for explaining a method of measuring surface levels in accordance with an exemplary embodiment of the present invention, and FIG. 9 is a conceptual diagram for explaining a method of reading surface levels in accordance with an exemplary embodiment of the present invention. Further, FIG. 10 is a conceptual diagram for explaining a method of selecting available cells in accordance with an exemplary embodiment of the present invention, and FIGS. 11 to 14 are conceptual diagrams for explaining a method of reading surface levels in accordance with another exemplary embodiment of the present invention. Furthermore, FIG. 15 is a schematic diagram of main parts of a semiconductor exposure apparatus in accordance with an exemplary embodiment of the present invention.

A method of reading surface levels according to an exemplary embodiment of the present invention will now be described with reference to FIGS. 3 to 9.

Referring to FIG. 3, the method of reading the surface levels includes aligning a sensing apparatus with the field (Step 51). The sensing apparatus may have at least one cell array composed of a plurality of cells. The field may be defined on a substrate such as a silicon wafer. Some of the cells constituting the at least one cell array are selected to select available cells (Step 53). Light is radiated onto a surface of the field (Step 55). Light reflected to the available cells from the surface is sensed to extract available level signals (Step 57). The available level signals are calculated to read the surface level (Step 59).

Referring to FIGS. 3 and 4, the field F may have a plurality of chips R1C1 to R3C3 arranged in a two-dimensional manner along rows R1, R2, and R3 and columns C1, C2, and C3. That is, the field F may have a first chip R1C1 arranged in the first column C1 of the first row R1 to a ninth chip R3C3 arranged in the third column C3 of the third row R3. In addition, the field F may have scribe lines SL disposed between the chips R1C1 to R3C3.

Referring to FIGS. 3 to 5, the substrate W may be a semiconductor substrate such as a round silicon wafer. The substrate W has an edge clearance EC set along its peripheral edge. For example, the silicon wafer may have a diameter of about 200 mm to 300 mm. The edge clearance EC may be set to a width of 2 mm to 3 mm around the peripheral edge of the silicon wafer.

In general, a semiconductor manufacturing process includes a process of coating a photoresist on the substrate W, and a process of transferring a fine pattern onto the photoresist. Exposure apparatuses such as a scanner and a stepper are widely employed to transfer the pattern onto the photoresist. In addition, the exposure apparatuses widely employ a reduction projection exposure technique in which the patterns are reduced and transferred.

The patterns are sequentially formed as indicated by the arrows 61 on the field F shown in FIG. 5. The semiconductor manufacturing process requires the patterns to be accurately transferred onto the chips R1C1 to R3C3. To this end, the photoresist should be positioned at the exact focal distance of the exposure apparatus. However, the substrate W may have relatively different levels, that is, it may be uneven, depending on its position due to bow, warpage, and so forth. Accordingly, the exposure apparatuses of exemplary embodiments of the present invention may have functions of reading the surface level on the field F basis, and controlling the substrate W in up, down, right, left, front, back, and rotational directions based the surface level or evenness.

Referring to FIGS. 3 and 6, the exposure apparatuses may have a light emitting unit 71 and a sensing apparatus SA for reading the surface levelness. The light emitting unit 71 emits light toward the surface of the field F. The surface of the field F may be positioned on a first level 75 or a second level 75'. The sensing apparatus SA acts to sense the light reflected from the surface of the field F of the substrate.

The light emitted from the light emitting unit 71 may be radiated toward the surface of the field F along a path indicated by an arrow 73. When the surface of the field F is positioned on a first level 75, the light reflected from the surface of the field F may reach the sensing apparatus SA along a path indicated by an arrow 77. On the other hand, when the surface of the field F is positioned on a second level 75', the light reflected from the surface of the field F may reach the sensing apparatus SA along a path indicated by an arrow 77'. That is, the light reflected from the surface of the field F has different paths depending on the surface level of the field F. The light having the different paths may be sensed and processed to read the surface level of the field F.

However, the light reflected from the surface of the photoresist may also be affected by a pattern printed below the photoresist or a structure thereof. That is, the light reflected from the surface on the chips R1C1 to R3C3 may have a different path from the light reflected from the surface on the scribe line SL. In other words, the light reflected from the surface on the scribe line SL may disturb the reading of the surface level of the field F. In addition the photoresist may have different thicknesses at the edge and the center of the substrate W. Accordingly, it is preferable to accurately read the surface levels on all of the chips R1C1 to R3C3 to form accurate patterns.

The field F may be classified into a measurement-allowed region and a measurement-restricted region. The measurement-allowed region may be set to overlap within the chips R1C1 to R3C3. The measurement-restricted region may be set to include the scribe line SL. The field F may overlap the edge clearance EC. In this case, the edge clearance EC and the chips in contact with the edge clearance EC may be set as the measurement-restricted region.

Referring to FIGS. 3, 6, and 7, the sensing apparatus SA may have a plurality of cells 80 arranged in a two-dimensional manner along row and column directions. The cells 80 may be implemented using light sensors such as photodiodes. The cells 80 arranged in the two-dimensional manner along the row and column directions may constitute a cell array CA. The sensing apparatus SA has at least one cell array CA.

As shown in FIG. 7, the sensing apparatus SA may have nine cell arrays CA arranged in a row. In this case, the cell arrays CA may act as a first sensor S1 to a ninth sensor S9. Alternatively, the sensing apparatus SA may have a plurality of cell arrays CA arranged in a donut or polygonal shape. Each of the cell arrays CA may be a complementary metal oxide semiconductor (CMOS) image sensor or a charge coupled device (CCD). The CMOS image sensor and the CCD may have the plurality of cells 80 arranged in a two-dimensional manner along the row and column directions.

Referring to FIGS. 3 and 8, the field F is aligned with the sensing apparatus SA (Step 51). In this case, a width 91 of the field F may be aligned to correspond to the third sensor S3 to the seventh sensor S7 of the sensing apparatus SA. The fifth sensor S5 may be aligned to correspond to a middle position of the field F. In this case, some portions of the third sensor S3 and the seventh sensor S7 may be out of the width 91 of the field F. Subsequently, the sensing apparatus SA may move in the order of the first row R1, the second row R2, and the third row R3 along the direction indicated by an arrow 20.

Referring to FIGS. 3 and 9, some of the cells 80 constituting the at least one cell array CA are selected to form available cells 100 (Step 53). The available cells 100 may be selected as cells S3', S4', S5', S6', and S7' corresponding to the measurement-allowed region among the cells 80. In this case, the first sensor S1, the second sensor S2, the eighth sensor S8, and the ninth sensor S9 are completely out of the field F, so that it is preferable to turn them off.

Light is radiated toward the surface of the field F from the light emitting unit 71 (Step 55). That is, first the light is radiated toward the surface of the first row R1 from the light emitting unit 71.

Light reflected to the available cells 100 from the surface of the first row R1 is sensed to extract available level signals (Step 57). Subsequently, the second row R2 of the field F is aligned with the sensing apparatus SA and the light emitting unit 71. Light is radiated toward the surface of the second row R2 from the light emitting unit 71. Light reflected to the available cells 100 from the surface of the second row R2 is sensed to extract available level signals. Subsequently, the third row R3 of the field F is aligned with the sensing apparatus SA and the light emitting unit 71. Light is radiated toward the surface of the third row R3 from the light emitting unit 71. Light reflected to the available cells 100 from the surface of the third row R3 is sensed to extract available level signals.

The available level signals may be used in calculations to read the surface levels of the field F (Step 59).

However, according to the conventional method of reading the surface level, the third sensor S3, the fourth sensor S4, the sixth sensor S6, and the seventh sensor S7, which overlap the measurement-restricted region, are turned off. In that case, surface levels of the fourth chip R1C2, the fifth chip R2C2, and the sixth chip R3C2, which are disposed in the second column C2, can be read whereas surface levels of the first chip R1C1, the second R2C1, the third chip R3C1, the seventh chip R1C3, the eighth chip R2C3, and the ninth chip R3C3 disposed in the first column C1 and the third column C3 cannot be read. Consequently, a degree of inclination in the direction of the rows R1, R2, and R3 cannot be known.

In the method of reading surface levels in accordance with an exemplary embodiment of the present invention, cells S3' and S4' corresponding to the measurement-allowed region of the first column C1 among the cells 80 may be included in the available cells 100. In addition, cells S6' and S7' corresponding to the measurement-allowed region of the third column C3 among the cells 80 may also be included in the available cells 100. Accordingly, the available level signals may include all information corresponding to each of the first chip R1C1 to the ninth chip R3C3. As a result, a degree of inclination in the direction of the rows R1, R2, and R3 as well as in the direction of the columns C1, C2, and C3 can be known. That is, the surface levels of the field F having various patterns can be accurately read.

Hereinafter, a method of reading surface levels according to an exemplary embodiment of the present invention will be described with reference to FIGS. 3 and 10 to 14.

Referring to FIGS. 3 and 10, various methods may be employed to select some of the cells 80 as available calls (Step 53). The cells 80 constituting the sensing apparatus SA may be displayed like a first group SA00. In addition, the cells 80 constituting the sensing apparatus SA may be divided into a first small group SA11, a second small group SA22, a third small group SA23, a fourth small group SA24, a fifth small group SA25, a sixth small group SA26, a seventh small group SA57, an eighth small group SA58, and a ninth small group SA89.

Specifically, the first small group SA11 may be a small group resulting from dividing the cells 80 that constitute the cell array CA into small groups of the same size. The second small group SA22 may be 20% of the cells 80 disposed at a middle position of the cell array CA. The third small group SA23 may be 20% of the cells 80 disposed at a left side position of the cell array CA. The fourth small group SA24 may be 20% of the cells 80 disposed at an upper side position of the cell array CA. The fifth small group SA25 may be 20% of the cells 80 disposed at a right side position of the cell array CA. The sixth small group SA26 may be 20% of the cells 80 disposed at a middle right side position of the cell array CA. The seventh small group SA57 may be 50% of the cells 80 disposed at an upper left side position of the cell array CA. The eighth small group SA58 may be 50% of the cells 80 disposed at a lower right side position of the cell array CA. The ninth small group SA89 may be 80% of the cells 80 disposed at a middle position of the cell array CA. In addition, it should be noted that the cells 80 may be divided and selected in a range of 1% to 99% by various methods.

Figure 11:
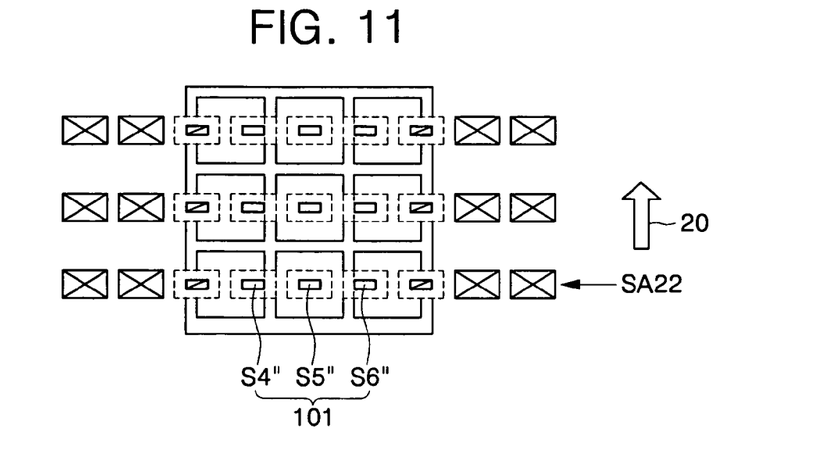
FIGS. 11 to 14 are conceptual diagrams for explaining a method of reading surface levels in accordance with an exemplary embodiment of the present invention.

Referring to FIGS. 3, 10 and 11, the second small group SA22 may be used to select the available cells 101. In this case, the available cells 101 may be selected as cells S4", S5", and S6" corresponding to the measurement-allowed region in the second small group SA22. In this case, sensors S3 and S7 overlapping the measurement-restricted region in the second small group SA22 are not employed. Light reflected to the available cells 101 is sensed to extract level signals for the available calls. In this exemplary embodiment, the level signals for the available calls may include all the information corresponding to each of the first chip R1C1 to the ninth chip R3C3. As a result, information about the degree of inclination in the direction of the rows R1, R2, and R3, as well as information about the degree of inclination in the direction of the columns C1, C2, and C3, can be obtained. That is, the surface levels of the field F having various patterns formed thereon may be accurately read.

Figure 12:
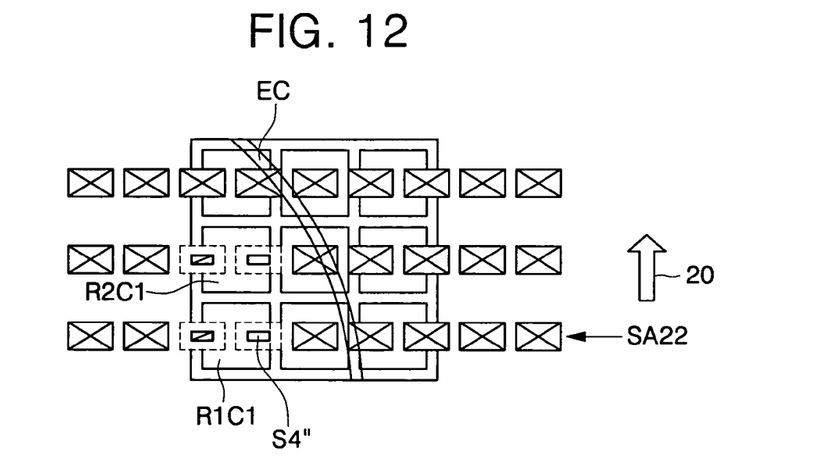

Referring to FIGS. 3, 10, and 12, the field F may overlap the edge clearance EC of the substrate W shown in FIG. 5. The edge clearance EC may be in contact with the third chip R3C1, the fourth chip R1C2, the fifth chip R2C2, and the sixth chip R3C2. As described above, the third chip R3C1, the fourth chip R1C2, the fifth chip R2C2, and the sixth chip R3C2, which are in contact with the edge clearance EC, may be set as the measurement-restricted region. In addition, the measurement-restricted region may include the scribe line SL shown in FIG. 4.

However, according to the conventional method of reading the surface levels, the third sensor S3 and the fourth sensor S4 overlap the measurement-restricted region so that they are turned off. Accordingly, the surface levels of the first chip R1C1 and the second chip R2C1 cannot be read using the conventional method. That is, the surface level of the field F overlapping the edge clearance EC cannot be read.

In contrast, according to the method of reading surface levels of the exemplary embodiment of the present invention, the second small group SA22 may be used to select available cells S4". The available cells S4" may overlap the first chip R1C1 and the second chip R2C1. Light reflected to the available cells S4" is sensed to extract level signals of the available cells. In this case, the level signals of the available cells may include information corresponding to each of the first chip R1C1 and the second chip R2C1. As a result, the surface levels of the first chip R1C1 and the second chip R2C1 can be read. That is, the surface level of the field F overlapping the edge clearance EC can be read.

Figure 13:
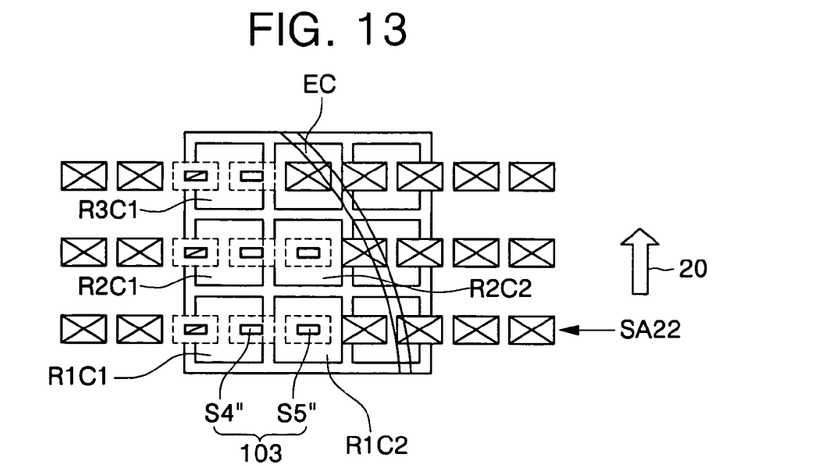

Referring to FIGS. 3, 10, and 13, the second column C2 and the third column C3 of the field F may overlap the edge clearance EC of the substrate W. The edge clearance EC may be in contact with the sixth chip R3C2, the seventh chip R1C3, the eighth chip R2C3, and the ninth chip R3C3. As described above, the sixth chip R3C2, the seventh chip R1C3, the eighth chip R2C3, and the ninth chip R3C3, which are in contact with the edge clearance EC, may be set as the measurement-restricted region. In addition, the measurement-restricted region may include the scribe line SL, as shown in FIG. 4.

However, according to the conventional method of reading surface levels, the third sensor S3 and the fourth sensor S4 overlap the measurement-restricted region so that they are turned off. Accordingly, the surface levels of the first chip R1C1, the second chip R2C1, and the third chip R3C1 cannot be read using the conventional method. Therefore, the surface level of the field F could be read using only the fifth sensor S5.

In contrast, according to the method of reading surface levels of the exemplary embodiment of the present invention, the second small group SA22 may be used to select available cells 103. In this case, the available cells 103 may be selected as cells S4" and S5" corresponding to the measurement-allowed region in the second small group SA22. In this case, the sensor S3 overlapping the measurement-restricted region in the second small group SA22 is not employed. Accordingly, the surface levels of the first chip R1C1, the second chip R2C1, the third chip R3C1, the fourth chip R1C2, and the fifth chip R2C2 can be read. That is, the surface level of the field F even overlapping the edge clearance EC can be read relatively accurately.

Figure 14:
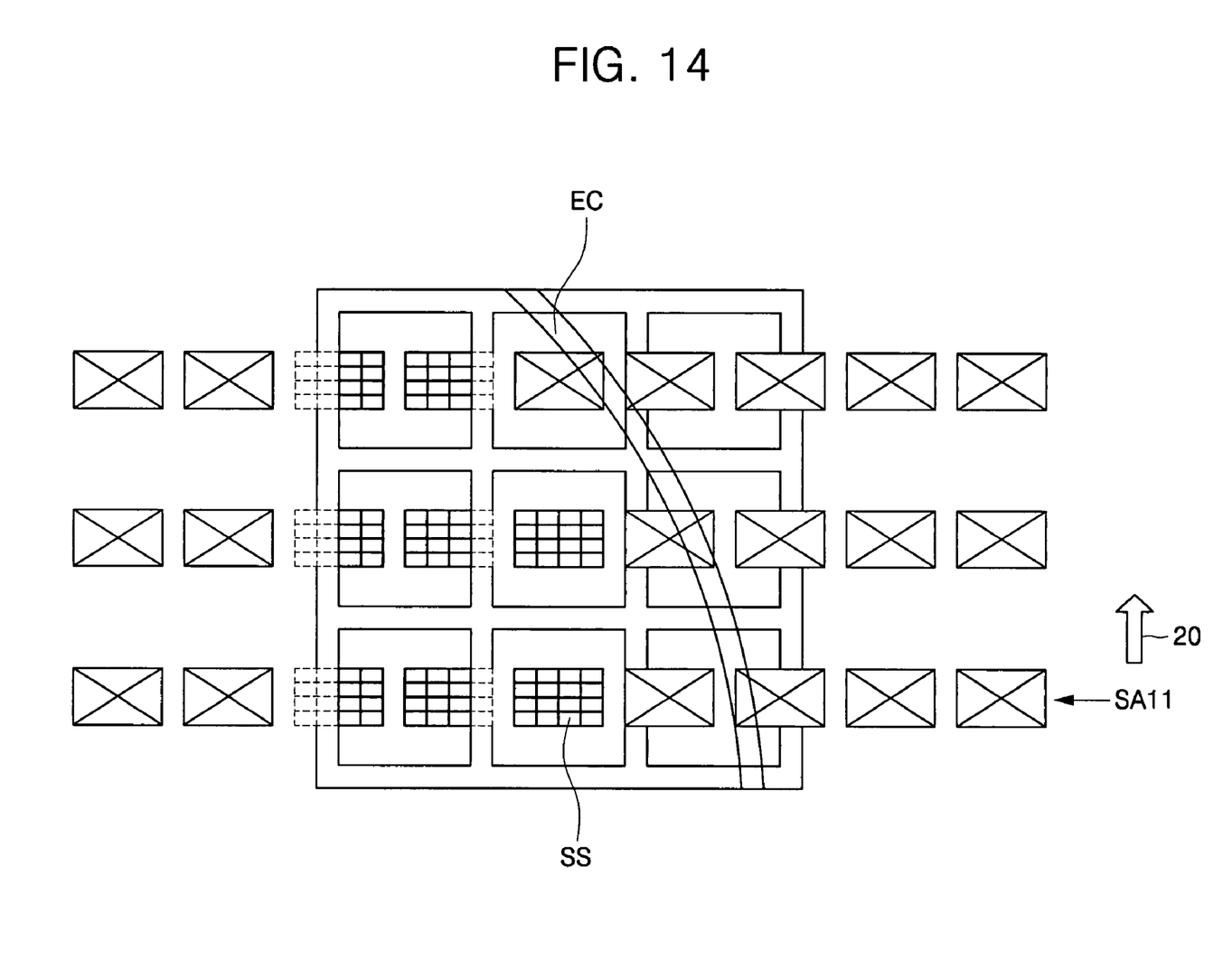
Figure 15:
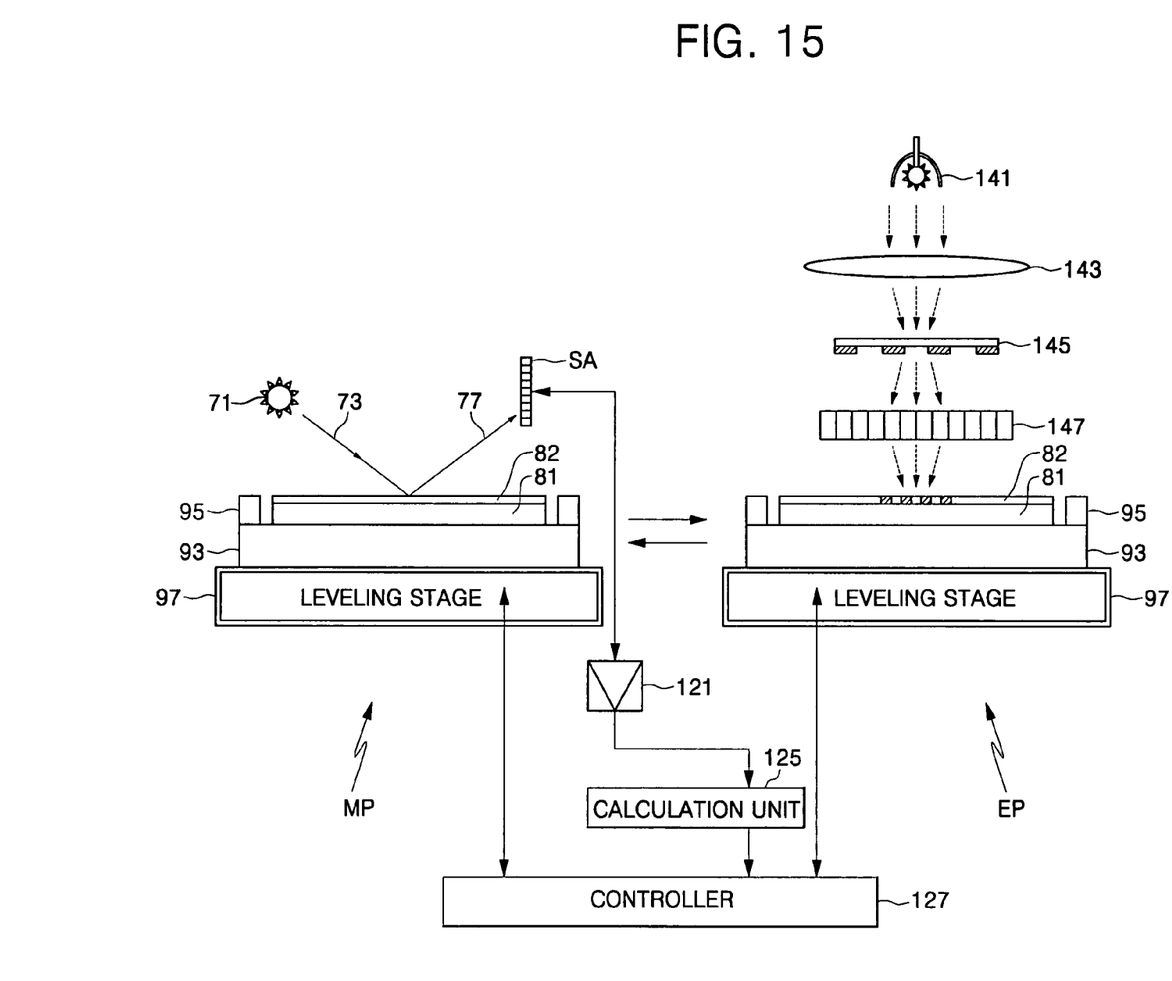
FIG. 15 is a schematic diagram of main parts of a semiconductor exposure apparatus in accordance with an exemplary embodiment of the present invention.

Referring to FIGS. 3, 10, and 14, when the second column C2 and the third column C3 of the field F overlap the edge clearance EC of the substrate W, the first smaller group SA11 may be used to read the surface level of the field F. As described above, the first smaller group SA11 may be a group SS resulting from dividing the cells 80 constituting the cell array CA into small groups SS of the same size. Some of the small groups SS having the same size, which correspond to the measurement-allowed region, may be used to read the surface level of the field F. Even in this case, the surface level of the field F overlapping the edge clearance EC can be read relatively accurately.

Hereinafter, a semiconductor exposure apparatus according to an exemplary embodiment of the present invention will be described with reference to FIG. 15.

Referring to FIG. 15, the semiconductor exposure apparatus according to an exemplary embodiment of the present invention may have a measurement position MP and an exposure is position EP. For example, the semiconductor exposure apparatus may be similar to the Twinscan apparatus available from ASML Veldhoven, The Netherlands.

In addition, the semiconductor exposure apparatus may have a wafer holder 93 and a leveling stage 97. A substrate 81 on which a field is defined may be mounted on the wafer holder 93. The substrate 81 may be a semiconductor substrate such as a silicon wafer. A photoresist 82 may be coated on the substrate 81. The wafer holder 93 may have a fiducial mark 95. The fiducial mark 95 may be disposed adjacent to the substrate 81 on a surface of the wafer holder 93 on which the substrate 81 is mounted. The fiducial mark 95 may act as a reference level allowing a relative level of the substrate 81 to be read. At least two fiducial marks 95 may be disposed on the wafer holder 93, as shown in FIG. 15. The leveling stage 97 may be attached to one surface of the wafer holder 93. The leveling stage 97 acts to move the substrate 81 mounted on the wafer holder 93 in up, down, right, left, front, back, and rotational directions.

The wafer holder 93 and the leveling stage 97 may be disposed to move in both the measurement position MP and the exposure position EP. Alternatively, the leveling stage 97 may be fixed in the exposure position EP. In this case, the wafer holder 93 may be separated from the exposure position EP so as to move in both the measurement position MP and the exposure position EP.

The measurement position MP may have the light emitting unit 71 and the sensing apparatus SA. The light emitting unit 71 may emit light toward the surface of the photoresist 82 along a path indicated by an arrow 73. That is, the light emitting unit 71 may act to emit light toward the surface of the field. The sensing apparatus SA may sense the light reflected from the surface of the photoresist 82 along a path indicated by an arrow 77. That is, the sensing apparatus SA may act to sense the light reflected from the surface of the field.

The sensing apparatus SA has at least one cell array composed of a plurality of cells. The sensing apparatus SA may have nine cell arrays disposed in a row, as shown in FIG. 7, for example. Each of the cell arrays may be a CMOS image sensor or a CCD. The cells may be arranged within the cell array in a two-dimensional manner along row and column directions. Each cell may include a photodiode. The CMOS image sensor and the CCD may have the plurality of cells arranged in a two-dimensional manner along the row and column directions.

The exposure position EP may have an illumination light 141, a condenser lens 143, a reticle 145, and a projection lens 147. The illumination light 141 may employ a G-line with a wavelength of 436 nm, an I-line with a wavelength of 365 nm, a KrF excimer laser with a wavelength of 248 nm, or an ArF excimer laser with a wavelength of 193 nm. Light emitted from the illumination light 141 may expose the photoresist 82 through the condenser lens 143, the reticle 145, and the projection lens 147. The reticle 145 may act as a mask that allows predetermined patterns to be projected onto the photoresist 82.

A cell selection unit 121 may be disposed adjacent the sensing apparatus SA. The sensing apparatus SA may be electrically connected to the cell selection unit 121. The cell selection unit 121 may act to select some of the cells constituting the at least one cell array CA and select available cells. In addition, the sensing apparatus SA may be electrically connected to a calculation unit 125 through the cell selection unit 121. The sensing apparatus SA may transmit available level signals sensed in the available cells to the calculation unit 125. The calculation unit 125 may act to receive the available level signals so as to read the surface level of the field based on the calculations. However, the sensing apparatus SA may be directly and electrically connected to the calculation unit 125 without going through the cell selection unit 121. The calculation unit 125 may be electrically connected to a controller 127. The calculation unit 125 may transmit the calculated information about the surface level of the field to the controller 127. The controller 127 may be electrically connected to the leveling stage 97. The controller 127 may act to transmit a position adjustment signal based on the surface level of the field to the leveling stage. The leveling stage 97 may act to move the substrate 81 mounted on the wafer holder 93 in up, down, right, left, front, back, and rotational directions in response to the position adjustment signal from the controller 127.

As shown in FIG. 15, the measurement position MP and the exposure position EP may be spaced apart from each other. In this case, the surface level of the field may be read by the measurement position MP. Subsequently, the leveling stage 97 in the exposure position EP may use the calculated surface level information to move the substrate 81 in up, down, right, left, front, back, and rotational directions. Alternatively, the measurement position MP may be disposed within the exposure position EP.

Hereinafter, a method of controlling the level of an exposure apparatus according to an exemplary embodiment of the present invention will be described with reference to FIGS. 7, 12, and 15.

Referring to FIGS. 7, 12, and 15, a field F is aligned with a sensing apparatus SA. The sensing apparatus SA may have at least one cell array CA composed of a plurality of cells 80. The sensing apparatus SA may have nine cell arrays disposed in a line. Each of the cell arrays may be a CMOS image sensor or a CCD. The cells may be arranged within the cell array in a two-dimensional manner along row and column directions. Each cell may include a photodiode. The CMOS image sensor and the CCD may have the plurality of cells disposed in a two-dimensional manner along the row and column directions.

The field F may be classified into a measurement-allowed region and a measurement-restricted region. The measurement-allowed region may be set to overlap within the chips R1C1 to R3C3. The measurement-restricted region may be set to include the scribe line SL. The field F may overlap the edge clearance EC. In this case, the edge clearance EC and the chips in contact with the edge clearance EC may be set as the measurement-restricted region.

Some of the cells 80 may be selected to select available cells S4" by the cell selection unit 121. The available cells S4" may be selected as cells corresponding to the measurement-allowed region.

As described above with reference to FIG. 12, the cell selection unit 121 may use the second small group SA22 to select the available cells S4". The available cells S4" may overlap the first chip R1C1 and the second chip R2C1.

Light may be radiated toward the surface of the field from the light emitting unit 71. Light reflected to the available cells S4" from the surface is sensed to extract available level signals. The available level signals may be transmitted from the sensing apparatus SA to the calculation unit 125. The calculation unit 125 may calculate the available level signals to read the surface level of the field F.

A substrate 81 whose surface level was read may be mounted on a leveling stage 97 at an exposure position EP of the apparatus. The calculation unit 125 may transmit the calculated surface level information of the field F to a controller 127. The controller 127 may transmit a position adjustment signal to the leveling stage 97 based on the surface level information of the field F. The leveling stage 97 may control the substrate 81 in up, down, right, left, front, back, and rotational directions in response to the position adjustment signal.

However, according to the conventional method of reading surface levels, the third sensor S3 and the fourth sensor S4 overlap the measurement-restricted region so that they are turned off. Accordingly, the surface levels of the first chip R1C1 and the second chip R2C1 cannot be read using the conventional method. That is, the surface level of the field F overlapping the edge clearance EC cannot be read. In this case, the leveling stage 97 is forced to control the substrate 81 without using all the surface level information of the field F.

On the other hand, according to the method of reading surface levels and controlling the exposure positions of the exemplary embodiments of the present invention, light reflected to the available cells S4" may be sensed to extract available level signals. In this case, the available level signals may include all information corresponding to each of the first chip R1C1 and the second chip R2C1. As a result, the surface levels of the first chip R1C1 and the second chip R2C1 can be read. That is, the surface level of the field F overlapping the edge clearance EC can be read. Consequently, the leveling stage 97 may control the substrate 81 in up, down, right, left, front, back, and rotational directions based on the surface level of the field F based on the calculated level information. That is, the level of the substrate 81 may be accurately controlled in the exposure apparatus.

According to exemplary embodiments of the present invention as described above, some of cells constituting at least one cell array are selected to select available cells, and light reflected to the available cells from a surface of a field is sensed to extract available level signals. The available level signals may be calculated to obtain information about the surface level of the field. Accordingly, the surface level of the substrate having various patterns formed thereof can be accurately read. In addition, the substrate mounted on a leveling stage may be controlled in up, down, right, left, front, back, and rotational directions using the calculated surface level information. Consequently, a semiconductor exposure apparatus capable of accurately controlling the level of the substrate can be implemented.

Exemplary embodiments of the present invention have been disclosed herein and, although specific terms are employed, they are meant to be interpreted in a generic and descriptive sense only and not for the purpose of limitation. Accordingly, it will be understood by those of ordinary skill in the art that various changes in form and details may be made to the exemplary embodiments without departing from the spirit and scope of the present invention as set forth in the following claims.

What is claimed is:

1. A method of reading a surface level of a field defined on a substrate using a sensing apparatus having at least one cell array composed of a plurality of cells, the method comprising:

assigning a measurement-allowed region of the field and assigning a measurement-restricted region of the field;

selecting some of the plurality of cells constituting the at least one cell array and designating the selected cells as available cells;

radiating light onto a surface of the field; and sensing light reflected from the surface of the field using the available cells and extracting available level signals;

wherein the selecting cells comprises:

dividing the cells constituting the cell array into small groups of a lesser number of cells; and selecting some of the small groups corresponding to the measurement-allowed region.

2. The method according to claim 1, wherein the field has a plurality of chips arranged in a two-dimensional manner along row and column directions, and a scribe line disposed between the chips, and wherein the measurement-allowed region is assigned to overlap the chips, and the measurement-restricted region is assigned to the scribe line.

3. The method according to claim 1, wherein the field has a plurality of chips arranged in a two-dimensional manner along row and column directions, a scribe line disposed between the chips, and an edge clearance, and wherein the measurement-allowed region is assigned to overlap the chips spaced apart from the edge clearance, and the measurement-restricted region is assigned to the scribe line and the chips in contact with the edge clearance.

4. The method according to claim 1, wherein the available cells correspond to the measurement-allowed region.

5. The method according to claim 1, wherein the plurality of cells are arranged within the cell array in a two-dimensional manner along row and column directions.

6. The method according to claim 1, wherein each of the plurality of cells comprises a photodiode.

7. The method according to claim 1, wherein the cell array is one of a complementary metal oxide semiconductor (CMOS) image sensor and a charge coupled device (CCD).

8. A method of controlling an exposure apparatus reading a surface level of a field defined on a substrate and controlling the surface level of the field using a sensing apparatus having at least one cell array composed of a plurality of cells, the method comprising:

selecting some of the plurality of cells constituting the at least one cell array and designating the selected cells as available cells;

radiating light onto a surface of the field;

sensing light reflected from the surface of the field using the available cells and extracting available level signals;

reading the surface level of the field using the available level signals;

mounting the substrate of which the surface level is read on a leveling stage of the exposure apparatus; and controlling the substrate mounted on the leveling stage in up, down, right, left, front, back, and rotational directions using the surface level obtained in the step of reading.

9. The method according to claim 8, further comprising assigning a measurement-allowed region of the field and assigning a measurement-restricted region of the field.

10. The method according to claim 9, wherein the available cells correspond to the measurement-allowed region.

11. The method according to claim 9, wherein selecting some of the cells designated as the available cells comprises:

dividing the cells constituting the cell array into small groups of a lesser number of cells; and selecting some of the small groups corresponding to the measurement-allowed region.

12. The method according to claim 8, wherein each of the plurality of cells comprises a photodiode.

13. The method according to claim 8, wherein the cell array is one of a complementary metal oxide semiconductor (CMOS) image sensor and a charge coupled device (CCD).

\* \* \* \* \*